United States Patent [19]

Holden et al.

[11] Patent Number: 4,475,045

[45] Date of Patent: Oct. 2, 1984

[54] RAPID PUMPDOWN FOR HIGH VACUUM PROCESSING

[75] Inventors: Scott C. Holden, Manchester; Norman L. Turner, Gloucester, both of Mass.

[73] Assignee: Varian Associates, Inc., Palo Alto, Calif.

[21] Appl. No.: 520,765

[22] Filed: Aug. 8, 1983

Related U.S. Application Data

[63] Continuation of Ser. No. 381,288, May 24, 1982, abandoned.

[51] Int. Cl.³ .......................... H01J 5/02; H01J 7/16; H01J 7/26
[52] U.S. Cl. ............................... 250/492.2; 250/397; 250/441.1; 250/443.1
[58] Field of Search ................. 250/443.1, 441.1, 397, 250/492.2

[56] References Cited

U.S. PATENT DOCUMENTS 3,206,598  9/1965  Wegmann ........................ 250/443.1
4,000,440 12/1976  Hall et al. ....................... 250/397 X
4,118,630 10/1978  McKenna et al. ............... 250/492.2
4,139,774  2/1979  Katagiri .......................... 250/441.1

OTHER PUBLICATIONS

"Model 200-DF5 Ion Implantation System", brochure by Varian Extrion Division, Jan. 1980.
Welch et al., *An Introduction to the Elements of Cryopumping*, 1979, p. III-1.

Primary Examiner—Janice A. Howell
Assistant Examiner—Jack I. Berman
Attorney, Agent, or Firm—Stanley Z. Cole; Edward H. Berkowitz; William R. McClellan

[57] ABSTRACT

Articles for irradiation are introduced from atmospheric pressure through a vacuum lock to a high vacuum environment for processing. The maintenance of low operating pressures while water vapor is released from the surfaces of the lock and the article is principally achieved by a separate pumping device operating in the high vacuum enclosure, which device preferably takes the form of a large cryo-panel. The cryo-panel can be electrically isolated from ground to provide a charge collection surface within a Faraday cage for ion implantation processing of the article.

7 Claims, 3 Drawing Figures

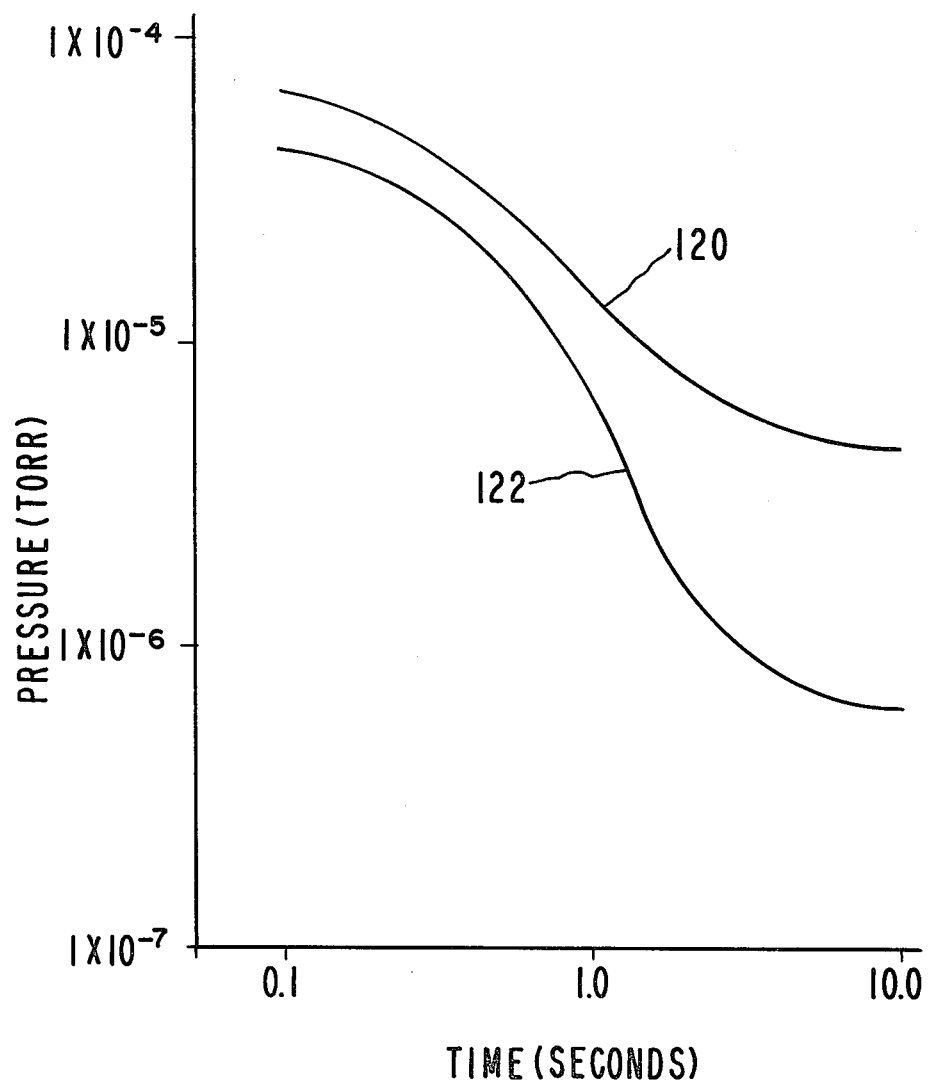

RAPID PUMPDOWN FOR HIGH VACUUM PROCESSING

This application is a continuation, of application Ser. No. 381,288, filed May 24, 1982, now abandoned.

DESCRIPTION

1. Field of the Invention

The present invention relates to high vacuum processing, particularly for the purpose of semiconductor processing by ion implantation equipment.

2. Background of the Invention

In the context of high volume treatment of semiconductor wafers by ion implantation and similar processes, it is necessary to introduce semiconductor wafers from ambient atmosphere to an end station of an ion implanter for processing under high vacuum conditions. Throughput, the volume of wafers processed per unit time, is limited in such processing by the time required to make the transition from ambient pressure to high vacuum. Pressure reduction is accomplished in two major steps; reduction to rough vacuum is ordinarily accomplished by mechanical displacement pumps which are then valved off; high vacuum pumps are then placed in the open communication with the processing chamber and workpieces.

Straightforward refinements to these operations include provision of small volume vacuum lock chambers wherein the main portion of the chamber remains constantly at high vacuum, while the smaller volume region containing the workpiece(s) is pumped to rough vacuum. The lock is then isolated from the roughing system and a valve separating the lock from the main chamber is then opened.

The evacuation of residual atmospheric gasses ($H_2$, $N_2$, $O_2$, $CO_2$ and inert gases) proceeds at a predictable exponential rate. The rapid evacuation of these gases is not generally the determining factor for the time interval required to reduce the pressure in a processing situation as described. This occurs because the surfaces of the workpiece which has been introduced to the chamber from atmosphere invariably appear as a virtual leak through the gradual release of molecules from the surfaces through a process known as outgassing. Outgassing rates vary in linear proportion to the surface area and inversely with time for such exemplary surfaces as typical metals. For polymers the time behavior typically follows an inverse square root dependence. A major contribution to the outgassing contribution to system pressure is attributed to water vapor which by its polar properties tends to persist in equilibrium with the workpiece surfaces.

It is known in the prior art to split the workpiece stream into two channels and to accomplish the "roughing out" pumpdown in one channel while final pumpdown to high vacuum and processing occurs in the other channel. This parallel processing mode does not obviate the limits imposed by the pumping processing itself.

In the prior art, the time interval for pressure reduction to high vacuum was decreased by increasing the pumping speed of the high vacuum pump. The pumping speed is a figure of merit which quantifies the volume of vapor per unit time which is displaced or captured by the pump. Increased physical size, capital and operating expense are concomitants of higher pumping speed and thus affect the economy of the operation.

It is known that pumping speed varies with the specific gas or gases pumped.

The processing chamber pressure experienced during ion implantation processing necessarily affects the measurement of "dose", the integrated charge deposited in the wafer. This is conveniently achieved by situating the workpiece in a Faraday cage from which the current to ground is then measured. When the pressure is sufficiently high for ionization of the residual gases (neutralization of the beam) to become appreciable due to the transmitted beam, the charge collection is, to that extent, a less accurate measure of the actual charged particle beam flux represented by the Faraday cage current integration.

BRIEF SUMMARY OF THE INVENTION

The present invention is based upon the observation that the time dependence of the pressure reduction for a cyclic processing environment has a first component which is exponential in time and depends on system properties independent of the processing steps. A second component depends upon the character of the workpiece which due to its importation from atmosphere brings with it a substantial $H_2O$ outgassing. The time dependence may be stated as $$P(t) = \Delta p \left( \exp\left( \frac{-tV_0}{S_0} \right) + \frac{Q_0}{S_0} \right) + \frac{(Q/A)_w}{S_{H_2O}(t)} + \frac{(Q/A)_p}{S_{H_2O} \sqrt{t}}$$

where
- $P(t)$ = the time dependent pressure of the processing chamber (Torr)
- $\Delta p$ = a pressure change due to the opening of a vacuum lock (Torr)
- $t$ = time elapsed from the opening of the vacuum lock (seconds)
- $S_O$ = total average pumping speed of the system for air (liters/sec.)
- $V_O$ = volume of process chamber (liters)
- $S_{H_2O}$ = pumping speed for $H_2O$
- $(Q/A)_w$ = outgassing constant for (uncoated) workpiece surface (Torr liter/cm$^2$)
- $(Q/A)_p$ = outgassing constant for polymer coating on workpiece (Torr liter/cm$^2$ sec$^{\frac{1}{2}}$)
- $A_w$ = exposed surface area of workpiece (cm$^2$)
- $A_p$ = surface area of polymer (cm$^2$)
- $Q_O$ = baseline equilibrium outgassing rate for process chamber interior surfaces (Torr liter/sec)

The right-hand side of the equation expresses a time independent term (the base line pressure) and an exponentially decaying term representing the pumping of atmospheric gases (other than water vapor) from the chamber following an instantaneous pressure pulse at $t=0$ (the opening of the vacuum lock at rough vacuum). The remaining terms express the time dependence in removal of $H_2O$ from the residual gases. The different time dependences originate in the surface effects with respect to water vapor for the workpiece including any polymer coatings thereon, or other polymers present (o-rings, etc.)

It is an object of the invention to minimize pumping apparatus requirements for ion implantation process equipment.

In one feature of the invention, sufficient pumping speed for residual gases (other than $H_2O$) is specified from a first high vacuum pump to sustain a desired steady state pressure within a selected time interval, and water vapor evolved from the workpiece is separately pumped in the same time interval by a large area cryogenic pumping device situated in close proximity to the workpiece.

In another feature of the invention, the cryogenic pumping device operates in the region from $-125°$ C. to $-150°$ C.

In yet another feature of the invention, the cryogenic pumping device is disposed within the charge collection region of said ion implantation process equipment and is electrically isolated from the chamber to serve as a charge collection surface.

These and other objects are achieved in a dual feed channel system wherein the reduction to rough vacuum is accomplished in one feed channel concurrently with high vacuum pumping and processing in the other channel. High vacuum pumping requirements are accomplished by a first pump of sufficient pumping speed (for atmospheric gases other than water vapor) to attain a desired base vacuum for the chamber volume within a preselected time interval. A second pump disposed (preferably in proximity to the workpiece) removes water vapor from the residual gases released by the workpiece through outgassing. The latter pump preferably takes the form of a large area cryo-panel mounted within the Faraday cage of the ion implanter end station.

BRIEF DESCRIPTION OF THE DRAWINGS

FIG. 3 is a comparison of measured performance with and without the cryo-panel of the present invention.

DETAILED DESCRIPTION OF THE PRESENT INVENTION

Figure 1:
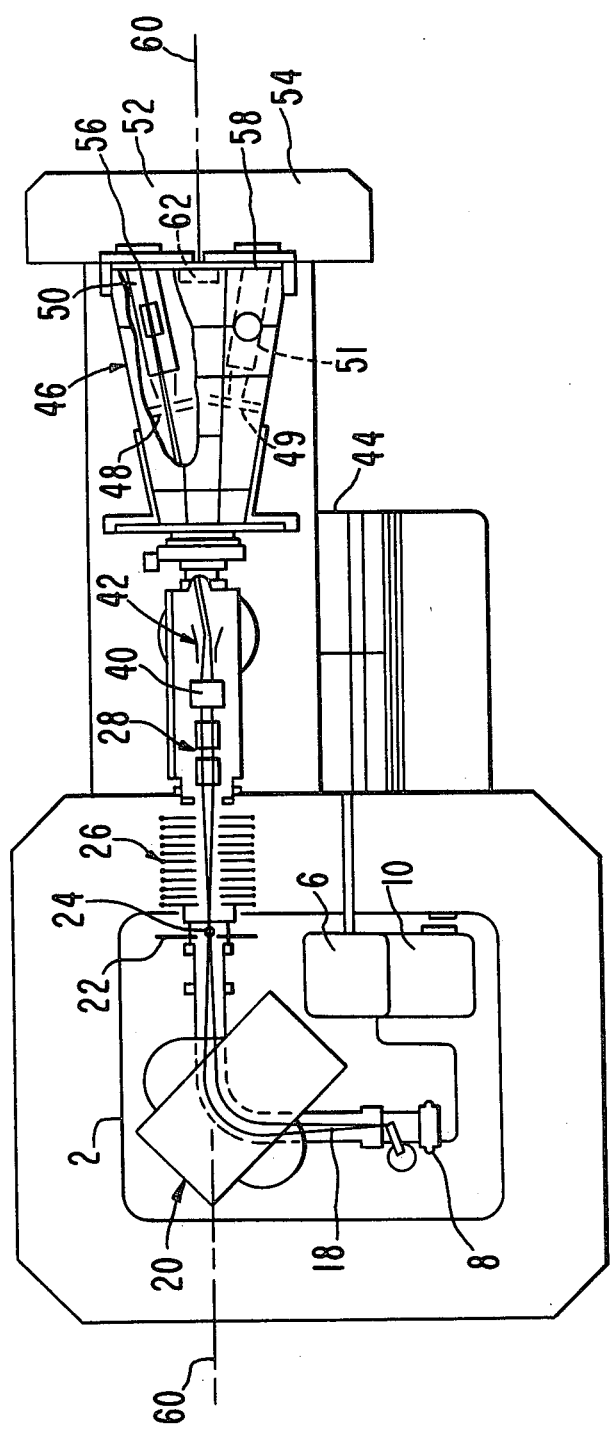
FIG. 1 is a schematic illustration of a typical ion implantation system.

The context of the present invention is best described with the aid of FIG. 1 which illustrates a typical ion implantation system. A high voltage terminal 2 is maintained at a selectable potential of $+10$ kev to $+200$ kev, typically, with respect to ground. Within the terminal 2 there is located an ion source 8 and associated power supplies 10, providing extraction, probe and focusing potentials which need not be considered in detail for the present purposes. Typically the ion source operates on a gaseous feed stock requiring gas handling system 6 which may be employed to select among several gas cylinders and to supply the selected gas to the ion source through a controlled leak. A high current ion beam 18 diverging from the ion source 8 is momentum analyzed in analyzer magnet 20 and issues from the magnet defined by aperture 22 and further limited by variable slit system 24. The beam is then accelerated to ground potential in accelerating tube 26. Optical elements 28 such as a quadrupole doublet, operate on the beam to yield a spatial momentum focus at the target planes 56 or 58. The typical system of FIG. 1 utilizes an electrostatic deflection system including y deflection plates 40 and x deflection plates 42 to direct the beam 18 over the selected target plane. The wave forms are developed in scan system 44 for application to the plates 40 and 42 to achieve a desired scanning pattern. A dual channel target chamber 46 is provided to house the workpiece(s) subject to processing. Included in the target chamber are beam defining slits 48 and 49 for the respective processing channels and Faraday cages 50 and 51 for charge collection and integration. An automatic wafer handling system including feed channels 52 and 54 service the two processing channels for introducing semiconductor wafers, one at a time through each of two vacuum locks for time-staggered introduction into the target chamber. The wafer handling system properly locates, aligns, cools the wafer during processing and removes the processed wafer from the chamber at the conclusion of processing. The wafer handling system is described in U.S. Pat. No. 4,311,427, commonly assigned with the present invention.

It is understood that the entire region traversed by the ion beam is maintained at high vacuum, e.g., typically, pressures of the order of $10^{-6}$ mm. Hg.

Figure 2:
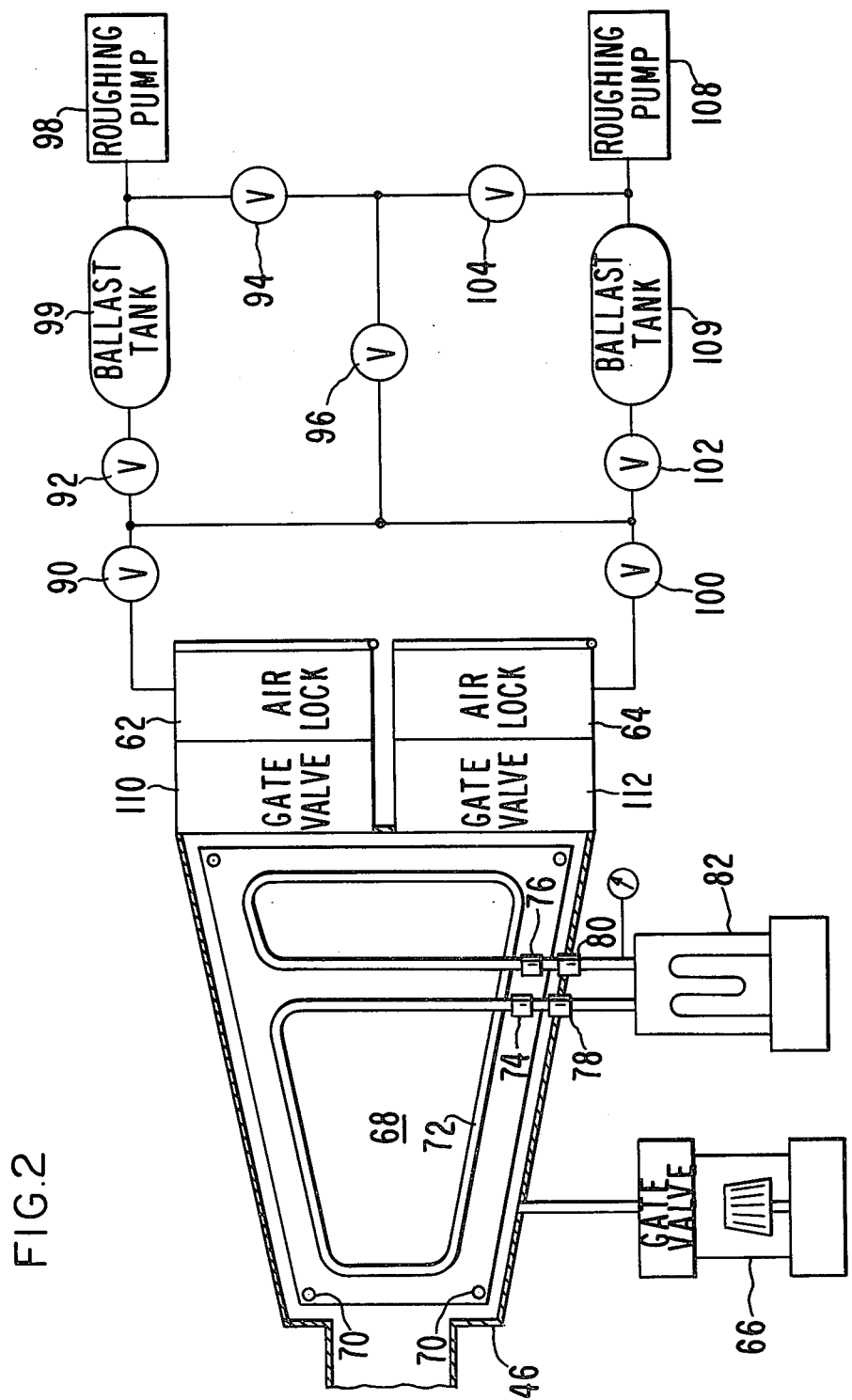
FIG. 2 is a schematic illustration of the vacuum system of the processing chamber of the present invention.

The target chamber 46 as shown in FIG. 2 comprises a generally trapezoidal section in the plane of the deflected beam to accommodate either of two alternate trajectories terminating at two respective end stations 62 and 64. Beam deflection apparatus, not shown, is housed upstream of the target chamber 46 as indicated in FIG. 1 and is understood to impose a desired central trajectory on the ion beam. A conventional high vacuum pumping port, preferably located on the floor of the chamber, communicates with a high vacuum pump 66. A 6" cryopump, Model VK12A, has been used to obtain a baseline pressure of $4 \times 10^{-7}$ Torr under production cycle conditions. A cryo-panel 68 is disposed parallel to the top surface of the chamber, and mechanical mounting is secured in straightforward fashion through mechanical insulating standoffs 70 to maintain electrical isolation of the cryo-panel from the chamber. The cryo-panel is typically constructed of ⅛ inch gauge stainless steel to which there is brazed a refrigerant circulation channel 72, preferably formed from stainless steel tubing of ¼ inch i.d. The surface of the panel is then electropolished and the refrigerant channel 72 is terminated in electrically isolated couplings 74 and 76 which in turn communicate through vacuum feedthroughs 78,80 to a refrigeration system 82. Satisfactory results have been obtained in the present system using a Polycold PCT-200 refrigeration system available from Polycold, Inc., San Rafael, Calif. This refrigeration system circulates refrigerant in channel 72 to maintain the cryo-panel in the range $-125°$ C. to $-150°$ C. The physical size of the target chamber permits a large area cryo-panel. In one system the area of the cryo-panel occupies ~2 square feet, e.g., four square feet total surface area. At a temperature of $-130°$ C., the cryo-panel 68 achieves a pumping speed in excess of 10,000 liters per second and is believed to reach pumping speeds as high as 20,000 liters per second for water vapor introduced into the chamber with the wafers.

The cryo-panel 68 is disposed within the charge collection region of the ion implantation system and is electrically isolated from the chamber to serve as a charge collection surface.

Electrical isolation of the cryo-panel permits a partial charge collection function to be served. The charge collection is independently derived from the wafer platen under ion bombardment and from other charge collection surfaces disposed within chamber 46. The collected charge for the several electrically isolated surfaces is then summed for a measure of the total beam current into the chamber.

A two-stage roughing cycle is employed for efficient pumpdown according to the scheme briefly described below. The wafer is secured to a platen at a given end station, for example end station 62, and after an interval of 0.2 seconds, valves 90 and 92 are opened to the first stage pumping of the roughing cycle. (Actuation of all valves in the process cycle is under control of a synchronization interlock logic system which monitors pressure conditions and other variables of the system. Such logic systems are well known and need not be discussed in detail.) Valves 94 and 96 remain closed with the result that the end station is evacuated by roughing pump 98 through expansion, or ballast, tank 99. Approximately 1/10 second is employed for this first stage pumping. The first stage is then valved off by valve controllers operating to close valve 92; after approximately 0.2 seconds, the second stage roughing pump 108 and expansion, or ballast, tank 109 are placed in open communication with the end station by opening valve 102. The latter pump reduces the pressure to approximately 200 microns within an interval of approximately 0.3 seconds; after 0.2 seconds, the roughing valve 90 and the second stage valve 102 have been closed and the high vacuum valve 110 opens to expose the wafer at end station 62 to the processing chamber 46. The expansion tanks 99 and 109 are continuously evacuated by the respective pumps 98 and 108 to augment the pumping efficiency within the constraints of a fixed duty cycle. This augmenting of the pumping efficiency is discussed in greater detail in copending U.S. Ser. No. 381,289, commonly assigned. Valves 94, 104 and 96 allow evacuation of inter-valve regions, e.g., valves 92-94 in straightforward fashion. Further vacuum plumbing, which need not be discussed, permits the roughing pumps to be applied to other requirements outside the processing cycle.

FIG. 3 is a comparison of the pumping performance of the target chamber 46 of the invention using the cryo-panel of the present invention (curve 122) and without utilizing the cryo-panel (curve 120).

The description in terms of a large area panel for water vapor cryopumping is not limiting as to that form. One will readily note the utility of equivalent surface area cryopumping within the target chamber region to accomplish the objective.

Although the discussion of the invention has been given in the context of an ion implanter, one will readily understand the invention is beneficial for any similar high vacuum process for which the workpiece is introduced from ambient condition and for which high throughput is a prime desiderata. Therefore, the invention should not be restricted to the described embodiments, but rather, should be limited only by the spirit and scope of the appended claims.

What is claimed is:

1. A cyclic processing system for charged particle radiation treatment of a plurality of objects in series, said objects loaded from ambient pressure to said processing system at high vacuum, comprising:
    a source of charged particles for irradiating each said object,
    a processing chamber and means for serially introducing each said object into said processing chamber, said processing chamber further comprising first pumping means for evacuating said processing chamber and second pumping means comprising at least one surface of area substantially greater than the area of said object said surface disposed in proximity and spaced apart from said object, and said surface in thermal communication with a coolant channel, a refrigerant circulating in said coolant channel and a refrigerant means for maintaining said refrigerant at a mean temperature in the range from $-125°$ C. to $-150°$ C., said surface being electrically isolated from said chamber and disposed within a charge collection cage for measurement of said charged particle radiation, whereby said surface collects a substantial proportion of the charged particle flux in the neighborhood of said object and said second pumping means is concurrently operative with said first pumping means for removal of the gases within said chamber to a pressure less than a preselected upper limit within a preselected time interval.

2. A processing system for charged particle radiation treatment of a workpiece loaded from ambient pressure to said processing system at high vacuum, comprising:
    means for generating a charged particle beam for irradiating said workpiece; and
    a processing chamber and means for introducing said workpiece into said processing chamber, said processing chamber further comprising first pumping means and second pumping means concurrently operative to reduce the pressure in said processing chamber to less than a preselected upper limit within a preselected time interval, said second pumping means being adapted for rapid pumping of water vapor from said processing chamber and comprising at least one cooled surface electrically isolated from said processing chamber to form at least part of a charge collection cage for measurement of said charged particle beam, and means for maintaining said cooled surface in a predetermined temperature range.

3. The processing system as defined in claim 2 wherein said means for maintaining said cooled surface in a predetermined temperature range includes a coolant channel in thermal communication with said cooled surface, a coolant circulating in said channel and refrigerator means for maintaining said coolant in said predetermined temperature range.

4. The processing system as defined in claim 3 adapted for serial processing of semiconductor wafers.

5. In a processing system for charged particle radiation treatment of a workpiece loaded from ambient pressure to said processing system at high vacuum, said system including means for generating a charged particle beam for irradiating said workpiece, a processing chamber, means for introducing said workpiece into said chamber, first pumping means for evacuating said processing chamber, and a charge collection cage for measurement of said charged particle beam, the improvement comprising:
    second pumping means adapted for rapid pumping of water vapor from said processing chamber and comprising at least one cooled surface disposed in said charge collection cage and in thermal communication with a coolant channel, a coolant circulating in said channel and refrigerator means for maintaining said coolant in a predetermined temperature range, said cooled surface being electrically isolated from said processing chamber and thereby concurrently operative to collect charged particles in said charge collection cage and, in conjunction with said first pumping means, to reduce the pressure within said charge collection cage to less than a preselected upper limit within a preselected time interval.

6. The processing system as defined in claim 4 wherein said predetermined temperature range is −125° C. to −150° C.

7. The processing system as defined in claim 4 wherein said cooled surface has sufficient area to achieve a pumping speed of at least 10,000 liters per second for water vapor.

* * * * *